(12) United States Patent
Li et al.

(10) Patent No.: US 10,388,329 B2
(45) Date of Patent: Aug. 20, 2019

(54) SSD STORAGE MODULE, SSD COMPONENT, AND SSD

(71) Applicant: SHENZHEN LONGSYS ELECTRONICS CO., LTD., Shenzhen (CN)

(72) Inventors: Zhixiong Li, Shenzhen (CN); Weiwen Pang, Shenzhen (CN); Xiaoqiang Li, Shenzhen (CN); Honghui Hu, Shenzhen (CN); Jinmou Qin, Shenzhen (CN)

(73) Assignee: SHENZHEN LONGSYS ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/120,707

(22) PCT Filed: Jul. 18, 2016

(86) PCT No.: PCT/CN2016/090290
§ 371 (c)(1),
(2) Date: Aug. 22, 2016

(87) PCT Pub. No.: WO2017/113756
PCT Pub. Date: Jul. 6, 2017

(65) Prior Publication Data
US 2017/0236558 A1 Aug. 17, 2017

(30) Foreign Application Priority Data

Dec. 30, 2015 (CN) .......................... 2015 1 1030196
Dec. 30, 2015 (CN) ..................... 2015 2 1140542 U
(Continued)

(51) Int. Cl.
*H05K 5/00* (2006.01)
*H05K 7/00* (2006.01)
(Continued)

(52) U.S. Cl.
CPC .................. *G11C 5/04* (2013.01); *G06F 1/16* (2013.01); *G06F 13/409* (2013.01);
(Continued)

(58) Field of Classification Search
CPC ......................................................... G06F 1/16
(Continued)

(56) References Cited

U.S. PATENT DOCUMENTS 5,461,256 A * 10/1995 Yamada ........... G06K 19/07745
257/679
2002/0080541 A1* 6/2002 Bunker ................... G06F 1/184
361/72
(Continued)

FOREIGN PATENT DOCUMENTS

CN 203118477 8/2013
CN 105575416 5/2016
(Continued)

OTHER PUBLICATIONS

International Search Report (English and Chinese) and Written Opinion of international application No. PCT/CN2016/090290, dated Oct. 24, 2016, total 11 pages.

*Primary Examiner* — Jerry Wu
(74) *Attorney, Agent, or Firm* — Calfee, Halter & Griswold LLP

(57) ABSTRACT

A SSD storage module comprising a printed circuit board (1), an encapsulating colloid (2), and an electronic circuit (3) welded on an inner surface of the printed circuit board (1) and having a data storage function; the encapsulating colloid (2) is formed on the inner surface of the printed circuit board (1) and is configured for seamlessly encapsulating the electronic circuit (3), an outer surface of the printed circuit board (1) is provided with a plurality of metal contact pieces (11), the plurality of metal contact pieces (11) are electrically
(Continued)

connected with the electronic circuit (3), and the plurality of metal contact pieces (11) comprise a plurality of SATA interface contact pieces (110). The encapsulating colloid (2) seamlessly encapsulates the electronic circuit (3) and isolates the electronic circuit (3) from the air, such that a problem that the electronic circuit (3) is directly exposed to the air, and performances of components of the electronic circuit (3) may be affected, thereby resulting in an unstable functionality of a SSD can be avoided.

9 Claims, 9 Drawing Sheets

(30) Foreign Application Priority Data

| | | |
|---|---|---|
| Dec. 31, 2015 | (CN) | 2015 1 1034559 |
| Dec. 31, 2015 | (CN) | 2015 2 1143864 U |
| Feb. 26, 2016 | (CN) | 2016 1 0109095 |

(51) Int. Cl.

| | |
|---|---|
| *G11C 5/04* | (2006.01) |
| *G06F 1/16* | (2006.01) |
| *G06F 13/40* | (2006.01) |
| *G06F 13/42* | (2006.01) |
| *G11C 5/14* | (2006.01) |
| *H01R 24/64* | (2011.01) |
| *H05K 1/18* | (2006.01) |
| *H05K 1/11* | (2006.01) |
| *H01R 107/00* | (2006.01) |
| *H05K 3/28* | (2006.01) |

(52) U.S. Cl.
CPC ...... *G06F 13/4068* (2013.01); *G06F 13/4282* (2013.01); *G11C 5/14* (2013.01); *H01R 24/64* (2013.01); *H05K 1/117* (2013.01); *H05K 1/181* (2013.01); *G06F 2213/0032* (2013.01); *H01R 2107/00* (2013.01); *H05K 3/284* (2013.01); *H05K 2201/10159* (2013.01); *H05K 2201/10181* (2013.01)

(58) Field of Classification Search
USPC .................................................... 361/679.01
See application file for complete search history.

(56) References Cited

U.S. PATENT DOCUMENTS

| | | | | |
|---|---|---|---|---|
| 2008/0089020 | A1* | 4/2008 | Hiew | H05K 9/0067 |
| | | | | 361/679.31 |
| 2010/0235693 | A1 | 9/2010 | Kang et al. | |
| 2010/0259882 | A1 | 10/2010 | Song | |
| 2016/0050744 | A1* | 2/2016 | Lee | H05K 1/0206 |
| | | | | 361/712 |

FOREIGN PATENT DOCUMENTS

| | | |
|---|---|---|
| CN | 205264341 | 5/2016 |
| CN | 205318847 | 6/2016 |
| CN | 205541950 | 8/2016 |

* cited by examiner

SSD STORAGE MODULE, SSD COMPONENT, AND SSD

TECHNICAL FIELD

The present application relates to the technical field of storage medium, and more particularly, relates to a Solid-State Drive (SSD) storage module, a SSD component and a SSD.

BACKGROUND

A hard disk is one of main storage mediums of a computer. Hard disks comprise a SSD (Solid-State Drive), the SSD is a hard disk made of solid state electronic storage chip arrays and has a very simple inner structure, a main body of the SSD is a piece of circuit board, and the most essential accessories of this circuit board are control chips, storage chips and some other auxiliary circuits.

A circuit module of an existing SSD is a finished SSD, of which control chips, storage circuits, and other circuit components are directly welded on a circuit board, and an outer shell of the SSD is then assembled to fabricate the SSD. With respect to an encapsulation using the aforesaid method, although the circuit board is placed in the outer shell of the SSD, there exists extra space in the outer shell of the SSD; therefore, circuit components may be directly exposed in the air, such that the circuit components are prone to be dampened and contaminated by dust, and performances of the circuit components may be further affected, thereby resulting in an unstable functionality of the SSD.

SUMMARY

A purpose of one embodiment of the present invention is providing a SSD (Solid-State Drive) storage module, which aims at solving a problem that in a traditional SSD encapsulating method, circuit components are directly exposed in the air, such that the circuit components are prone to be dampened and contaminated by dust, performances of the circuit components may be further affected, thereby resulting in an unstable functionality of the SSD.

The embodiment of the present invention is implemented as follows: a SSD storage module, wherein the SSD storage module comprises a printed circuit board, an encapsulating colloid, and an electronic circuit welded on an inner surface of the printed circuit board and having a data storage function;

the encapsulating colloid is formed on an inner surface of the printed circuit board and is configured for seamlessly encapsulating the electronic circuit;

an outer surface of the printed circuit board is provided with a plurality of metal contact pieces that are electrically connected with the electric circuit, and the plurality of metal contact pieces comprise a plurality of SATA interface contact pieces;

the electronic circuit comprises a control integrated circuit, a storage integrated circuit, and an auxiliary circuit; the control integrated circuit is electrically connected with the storage integrated circuit and the auxiliary circuit respectively;

the plurality of SATA interface contact pieces are all strip-shaped, lengths of the plurality of SATA interface contact pieces are not all identical, and the plurality of SATA interface contact pieces are arranged on a side of the outer surface of the printed circuit board.

Further, a side of the printed circuit board where the plurality of SATA contact pieces are arranged is provided with a separation slot; in a direction perpendicular to the printed circuit board, the separation slot penetrates from the outer surface of the printed circuit surface to an inner surface the printed circuit board and the encapsulating colloid; the plurality of SATA interface contact pieces are divided by the separation slot into a first contact piece area and a second contact piece area, and the side of the printed circuit board provided with the separation slot and the plurality of SATA interface contact pieces serves as a component part of a standard SATA interface assembly.

Furthermore, the first contact piece area is provided with seven metal contact pieces, and the second contact piece is provided with fifteen metal contact pieces.

Furthermore, each of two edges of an end surface of the SSD storage module that is at the same side as the separation slot is provided with a bevel edge.

Furthermore, both the control integrated circuit and the storage integrated circuit are not encapsulated integrated circuit crystal grains; the storage integrated circuit comprises eight storage integrated circuit crystal grains, the eight storage integrated circuit crystal grains are stacked up on two sides, and there are eight stacked storage integrated circuit crystal grains stacked up on each side.

Furthermore, the auxiliary circuit comprises a power supply circuit, and the power supply circuit is composed of integrated circuit crystal grains that are not encapsulated.

Furthermore, the auxiliary circuit further comprises a protection circuit, the protection circuit is a self-recovery fuse wire and is connected in series to an input end of the power supply circuit.

Furthermore, the plurality of metal contact pieces further comprise a debugging interface contact piece and a power supply interface contact piece.

Furthermore, a module formed by encapsulating the printed circuit board with the encapsulating colloid has a length of 33.4±0.08 mm, a width of 22.6±0.1 mm and a height of 1.23±0.05 mm; or has a length of 33.4±0.08 mm, a width of 17.2±0.1 mm, and a height of 1.23±0.05 mm; or has a length of 33.4±0.08 mm, a width of 15±0.1 mm and a height of 1.23±0.05 mm.

The present invention further provides a SSD component, the SSD component comprises a plate body, and the SSD component further comprises a plastic piece and the aforesaid SSD storage module; the plastic piece is arranged on the plate body and is provided with an opening, the plate body is provided thereon with a locating slot being adjacent to a side of the plastic piece and communicated with the opening, the SSD storage module inserts from the opening and is received in the locating slot; the plurality of SATA interface contact pieces are exposed at the opening and constitute a standard SATA storage interface with the opening; the plastic piece is provided thereon with a hook located at an inner side of the opening, and the hook is hooked at the separation slot of the SSD storage module.

Further, two side edges of the locating slot are provided with two card slots respectively, a bottom of each of the two card slots is provided with a support plate, two ends of the SSD storage module are respectively placed on the two support plates, a top end of each of the two card slots extends inwardly to form a pressing block, and the two pressing blocks are arranged to press on two ends of the SSD storage module respectively.

As an alternative solution of the aforesaid SSD storage module, in the SSD storage module, two side edges of an end of the module formed by encapsulating the printed circuit board with the encapsulating colloid that is distant from the plurality of SATA interface contact pieces are respectively provided with bayonets configured for fixedly fitting with an external structure.

The present invention further provides a SSD component, the SSD component comprises a plate body, and further comprises a plastic piece and the SSD storage module of the aforesaid alternative solution; the plastic piece is arranged on the plate body and is provided with an opening, the plate body is provided thereon with a locating slot which is adjacent to a side of the plastic piece and is communicated with the opening; two opposite inner side edges of the locating slot are provided with two fixture blocks respectively; the SSD storage module inserts from the opening and is received in the locating slot, the two fixture blocks respectively engage in the two bayonets of the SSD storage module; the plurality of SATA interface contact pieces are exposed at the opening and constitute a standard SATA storage interface with the opening.

Further, each of the two opposite side edges of the locating slot extends inwardly to form a plurality of upper retaining blocks and lower retaining blocks, an edge of the SSD storage module is clamped between the upper retaining blocks and the lower retaining blocks.

Furthermore, the two opposite side edges of the locating slot are provided with hollow slots and through-holes located at the two fixture blocks respectively.

Furthermore, an edge of the locating slot opposite to the plastic piece is provided with a plurality of bulges, and the hollow slots and the through-holes are defined in the bulges.

Furthermore, a lower surface of the plate body is provided with a plurality of reinforcing ribs located at a side of the locating slot.

The present invention further provides a SSD, wherein the SSD comprises the aforesaid SSD storage module.

The present invention further provides a SSD, wherein the SSD comprises the aforesaid SSD component.

In the embodiments of the present invention, the SSD storage module comprises a printed circuit board, an encapsulating colloid, and an electronic circuit welded on an inner surface of the printed circuit board and having a data storage function; the encapsulating colloid is formed on the inner surface of the printed circuit board and is configured for seamlessly encapsulating the electronic circuit; an outer surface of the printed circuit board is provided with a plurality of metal contact pieces that are electrically connected to the electronic circuit; the plurality of metal contact pieces comprise a plurality of SATA (Serial Advanced Technology Attachment) interface contact pieces. In the embodiments of the present invention, the encapsulating colloid is configured for seamlessly encapsulating the electronic circuit welded on the inner surface of the printed circuit board, the encapsulating colloid isolates the electronic circuit from the air, such that the problem that the electronic circuit is directly exposed in the air, performances of components of the electronic circuit are affected, thereby resulting in an unstable functionality of the SSD can be avoided.

DETAILED DESCRIPTION OF THE PREFERRED EMBODIMENT

In order to make the purposes, technical solutions, and advantages of the present invention be clearer and more understandable, the present invention will be further described in detail hereinafter with reference to the accompanying drawings and embodiments. It should be understood that the embodiments described herein are only intended to illustrate but not to limit the present invention.

Embodiment I

Figure 1:
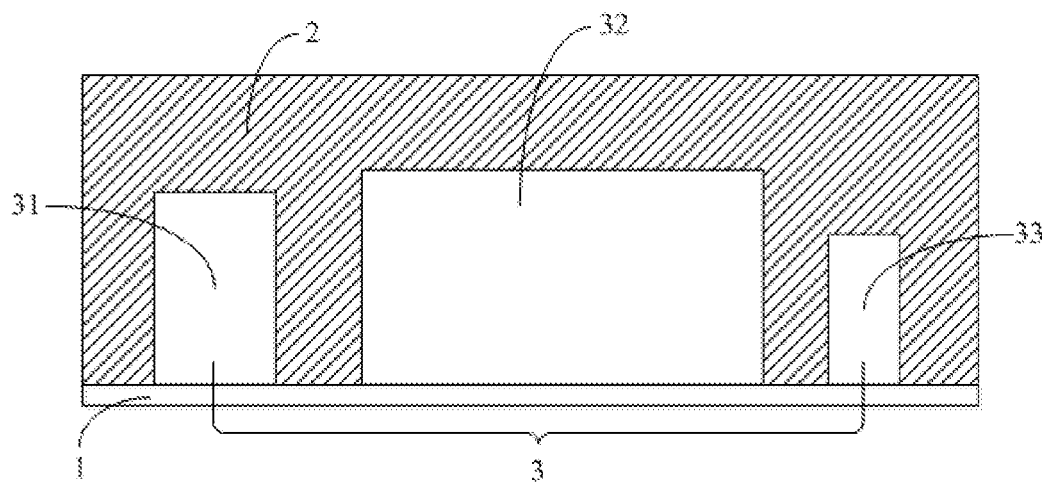
FIG. 1 illustrates a cross-section view of a SSD storage module provided by a preferred embodiment of the present invention.

FIG. 1 illustrates a cross-section view of a SSD (Solid-State Drive) storage module provided by a first embodiment of the present invention, for conveniently illustrating, only a part relevant to the embodiment of the present invention is illustrated.

A SSD storage module, the SSD storage module comprises a printed circuit board 1, an encapsulating colloid 2, and an electronic circuit 3 welded on an inner surface of the printed circuit board 1 and having a data storage function.

The encapsulating colloid 2 is formed on the inner surface of the printed circuit board 1 and is configured for seamlessly encapsulating the electronic circuit 3.

An outer surface of the printed circuit board 1 is provided with a plurality of metal contact pieces 11, the plurality of metal contact pieces 11 are electrically connected to the electronic circuit 3; the plurality of metal contact pieces 11 comprise a plurality of SATA (Serial Advanced Technology Attachment) interface contact pieces 110.

The electronic circuit 3 comprises a control integrated circuit 31, a storage integrated circuit 32 and an auxiliary circuit 33; the control integrated circuit 31 is electrically connected with the storage integrated circuit 31 and the auxiliary circuit 33 respectively.

In this embodiment, SATA interface is a computer bus interface which is configured for data transmission between a SSD and a main board.

As an embodiment of the present invention, both the control integrated circuit 31 and the storage integrated circuit 32 are integrated circuit crystal grains that are not encapsulated. In this embodiment, the control integrated circuit 31 and the storage integrated circuit 32 directly use integrated circuit crystal grains that are not encapsulated, so that a step of encapsulating the control integrated circuit crystal grains and storage integrated circuit crystal grains to form a chip can be omitted, time is saved, a production period is shortened, and production cost is reduced.

As an embodiment of the present invention, the storage integrated circuit 31 comprises eight storage integrated circuit crystal grains, the eight storage integrated circuit crystal grains are stacked up on two sides, there are four storage integrated circuit crystal grains stacked up at each side.

As an embodiment of the present invention, the auxiliary circuit 33 comprises a power supply circuit, and the power supply circuit is composed of integrated circuit crystal grains that are not encapsulated.

As an embodiment of the present invention, the auxiliary circuit further comprises a protection circuit, the protection circuit is a self-recovery fuse wire, and the self-recovery fuse wire is connected in series to an input port of the power supply circuit. In this embodiment, the protection circuit provides protection for the power supply circuit, and the protection circuit uses the self-recovery fuse wire such that the SSD storage module can be more light and thin.

As an embodiment of the present invention, the plurality of metal contact pieces 11 further comprise a plurality of debugging interface contact pieces and a plurality of power interface contact pieces. Specifically, the total number of the debugging interface contact pieces and the power interface contact pieces is sixteen. The debugging interface contact pieces provide a debugging interface of the SSD storage module for an external, and the power supply interface contact piece is configured for connecting to an external power supply.

Figure 2:
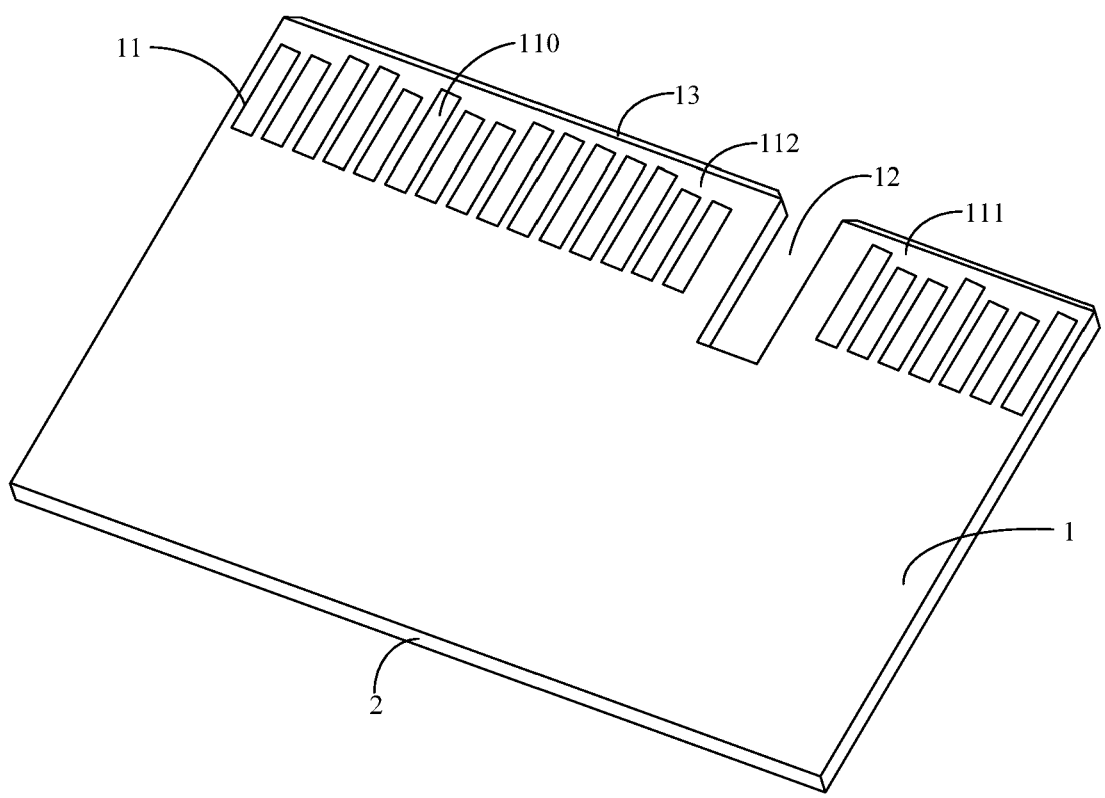
FIG. 2 illustrates a schematic view of a SSD storage module provided by a first embodiment of the present invention.

FIG. 2 illustrates a schematic diagram of the SSD storage module provided by a first embodiment of the present invention, for conveniently illustrating, only a part relevant to the embodiment of the present invention is illustrated.

The plurality of SATA interface contact pieces 110 are all strip-shaped, lengths of the plurality of SATA interface contact pieces 110 are not all identical, and the plurality of SATA interface contact pieces 110 are arranged on a side of an outer surface of the printed circuit board 1.

In this embodiment, there are a plurality of metal contact pieces 11. Specifically, the metal contact pieces 11 comprise twenty-two SATA interface contact pieces 110.

As an embodiment of the present invention, a side of the printed circuit board 1 where the plurality of SATA interface contact pieces 11 are arranged is provided with an separation slot 12; in a direction perpendicular to the printed circuit board 1, the separation slot 12 penetrates from the outer surface of the printed circuit board 1 to an inner surface of the printed circuit board 1 and the encapsulating colloid 2; the plurality of SATA interface contact pieces 11 are separated by the separation slot 12 into a first contact piece area 111 and a second contact piece area 112, and the side of the printed circuit board 1 provided with the separation slot 12 and the plurality of SATA interface contact pieces 11 serves as a standard SATA interface assembly, and the standard SATA interface assembly further comprises a plastic piece.

As an embodiment of the present invention, the first contact piece area 111 is provided with seven SATA interface contact pieces 11, the second contact piece area 112 is provided with fifteen SATA interface contact pieces 11.

As an embodiment of the present invention, each of two edges of an end surface of SSD storage module that is at the same side as the separation slot 12 is further provided with a bevel edge 13, the SSD storage module can be conveniently electrically connected to an external accessory through the bevel edge 13.

As an embodiment of the present invention, a module formed by encapsulating the printed circuit board 1 with the encapsulating colloid 2 has a length of 33.4±0.08 mm, a width of 22.6±0.1 mm and a height of 1.23±0.05 mm; or has a length of 33.4±0.08 mm, a width of 17.2±0.1 mm, and a height of 1.23±0.05 mm; or has a length of 33.4±0.08 mm, a width of 15±0.1 mm and a height of 1.23±0.05 mm.

Embodiment II

FIG. 1 illustrates a cross-section view of the SSD (Solid-State Drive) storage module provided by a second embodiment of the present invention, for conveniently illustrating, only the part relevant to the embodiment of the present invention is illustrated.

A SSD storage module, the SSD storage module comprises a printed circuit board 1, an encapsulating colloid 2 and a electronic circuit 3 welded on an inner surface of the printed circuit board 1 and having a data storage function.

The encapsulating colloid 2 is formed on the inner surface of the printed circuit board 1 and is configured for encapsulating seamlessly.

An outer surface of the printed circuit board 1 is provided with a plurality of metal contact pieces 11, the plurality of metal contact pieces 11 are electrically connected to the electronic circuit 3; the plurality of metal contact pieces 11 comprise a plurality of SATA (Serial Advanced Technology Attachment) interface contact pieces 110.

The electronic circuit 3 comprises a control integrated circuit 31, a storage integrated circuit 32 and an auxiliary circuit 33; the control integrated circuit 31 is electrically connected with the storage integrated circuit 31 and the auxiliary circuit 33 respectively.

In this embodiment, a SATA interface is a computer bus interface and is configured for data transmission between a SSD and a main board.

As an embodiment of the present invention, both the control integrated circuit 31 and the storage integrated circuit 32 are integrated circuit crystal grains that are not encapsulated. In this embodiment, the control integrated circuit 31 and the storage integrated circuit 32 directly use integrated circuit crystal grains that are not encapsulated, so that a step of encapsulating the control integrated circuit crystal grains and storage integrated circuit crystal grains to form a chip can be omitted, time is saved, a production period is shortened, and production cost is reduced.

As an embodiment of the present invention, the storage integrated circuit 31 comprises eight storage integrated circuit crystal grains, the eight storage integrated circuit crystal grains are stacked up on two sides, there are four storage integrated circuit crystal grains stacked up respectively on each side.

As an embodiment of the present invention, the auxiliary circuit 33 comprises a power supply circuit, the power supply circuit is composed of integrated circuit crystal grains that are not encapsulated.

As an embodiment of the present invention, the auxiliary circuit further comprises a protection circuit, the protection circuit is a self-recovery fuse wire and is connected in series to an input port of the power supply circuit. In this embodiment, the protection circuit provides protection for the power supply circuit, and the protection circuit uses the self-recovery fuse wire such that the SSD storage module can be more light and thin.

As an embodiment of the present invention, the plurality of metal contact pieces 11 further comprise a plurality of debugging interface contact pieces and power interface contact pieces. Specifically, a total number of the debugging interface contact pieces and the power interface contact pieces is sixteen. The debugging interface contact pieces provide a debugging interface of the SSD storage module for an external, and the power supply interface contact piece is configured for connecting to an external power supply.

Figure 3:
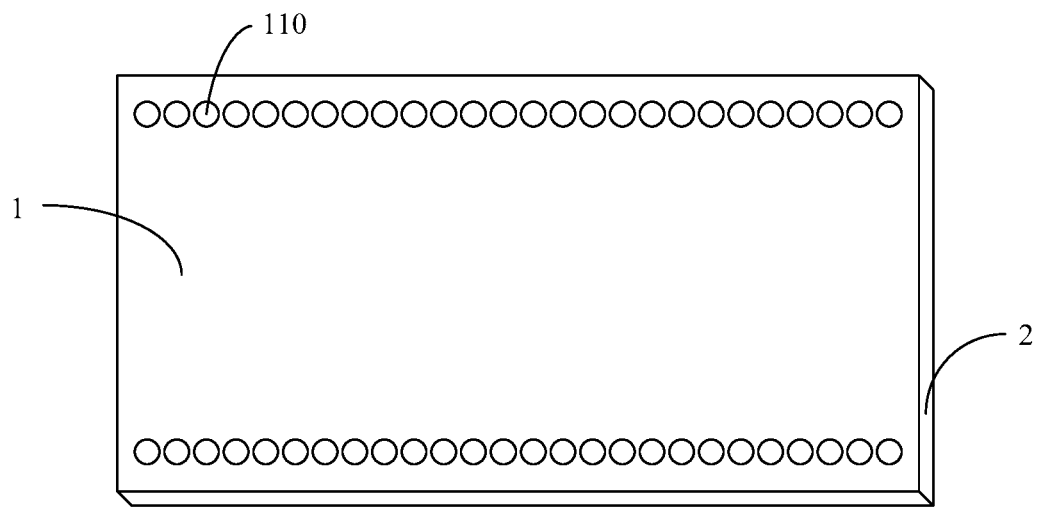
FIG. 3 illustrates a schematic view of a SSD storage module provided by a second embodiment of the present invention.

FIG. 3 illustrates a schematic view of SSD storage module provided by a second embodiment of the present invention, for conveniently illustrating, the part relevant to the embodiment of the present invention is illustrated merely.

As an embodiment of the present invention, the plurality of SATA interface contact pieces 110 are dot-shaped and are arranged on a side of the outer surface of the printed circuit board 1.

As an embodiment of the present invention, another side of the outer surface of the printed circuit board 1 parallel and symmetric to the side where the plurality of SATA interface contact pieces 110 are arranged is provided with another group of SATA interface contact pieces, and the number of the another group of SATA interface contact pieces is equal to that of the plurality of the SATA interface contact pieces 110.

As an embodiment of the present invention, a module formed by encapsulating the printed circuit board 1 with the encapsulating colloid 2 has a length of 33.4±0.08 mm, a width of 22.6±0.1 mm and a height of 1.23±0.05 mm; or has a length of 33.4±0.08 mm, a width of 17.2±0.1 mm, and a height of 1.23±0.05 mm; or has a length of 33.4±0.08 mm, a width of 15±0.1 mm and a height of 1.23±0.05 mm.

Embodiment III

Figure 4:
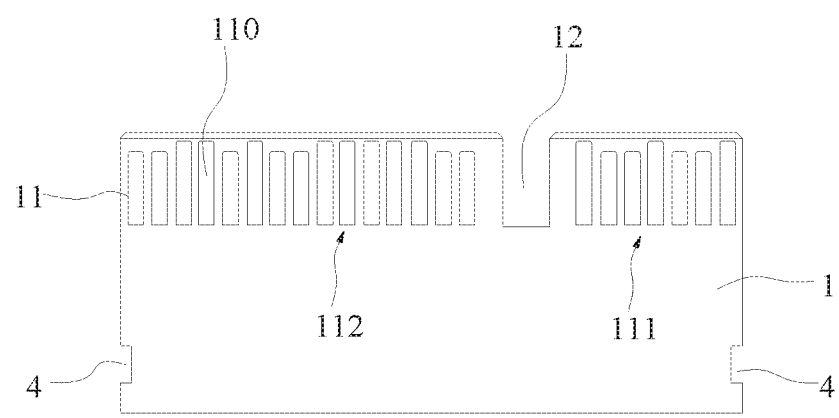
FIG. 4 illustrates a schematic top view of a SSD storage module provided by a third embodiment of the present invention.

Please refer to FIG. 4, which is a structural schematic view of a SSD (Solid-State Drive) storage module provided by a third embodiment of the present invention. The third embodiment differs from the first and second embodiments in that: two side edges of an end of the module formed by encapsulating the printed circuit board 1 with the encapsulating colloid 2 that is distant from the plurality of SATA (Serial Advanced Technology Attachment) interface contact pieces 110 are respectively provided with bayonets 4 configured for fixedly fitting with an external structure.

Another difference between this embodiment and the first and second embodiments is that: an inner end of the separation slot 12 distant from the printed circuit board 1 is flush with inner ends of the plurality of SATA interface contact pieces 110. This flush structure facilitates the circuit arrangement of the printed circuit board 1.

Other parts which are not illustrated in this embodiment are the same as that of the first embodiment or the second embodiment, and need not to be repeatedly illustrated here.

Embodiment IV

Figure 5:
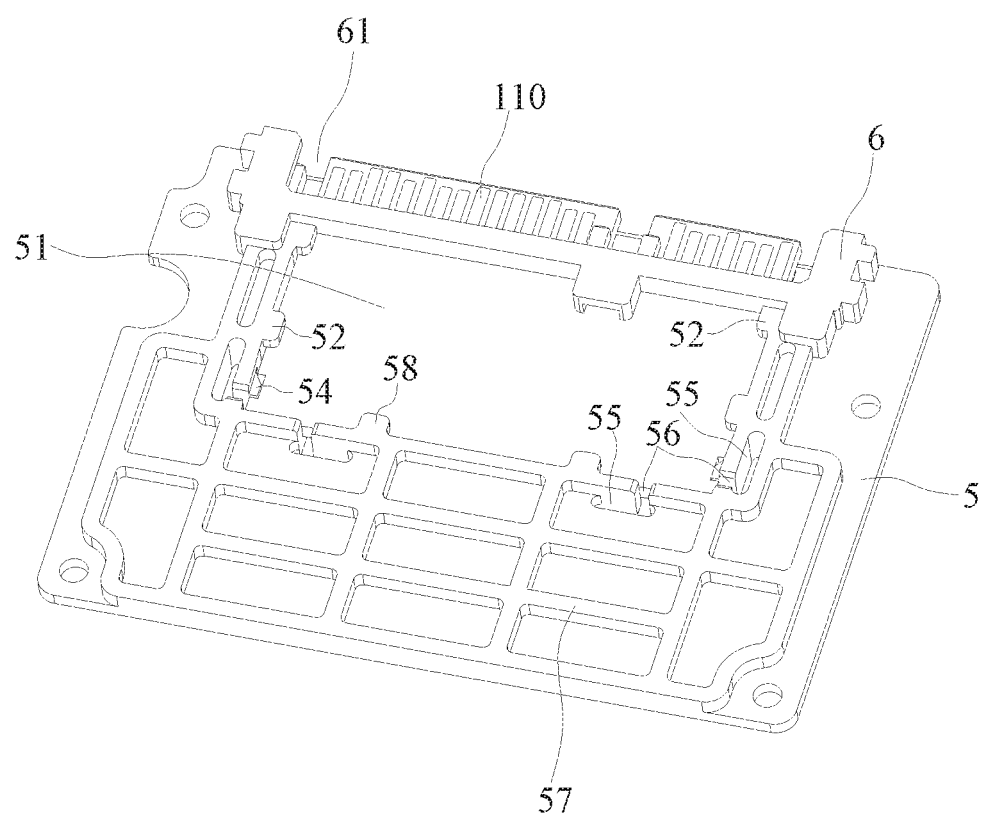
FIG. 5 illustrates a structural schematic view of a SSD storage module provided by a fourth embodiment of the present invention.
Figure 6:
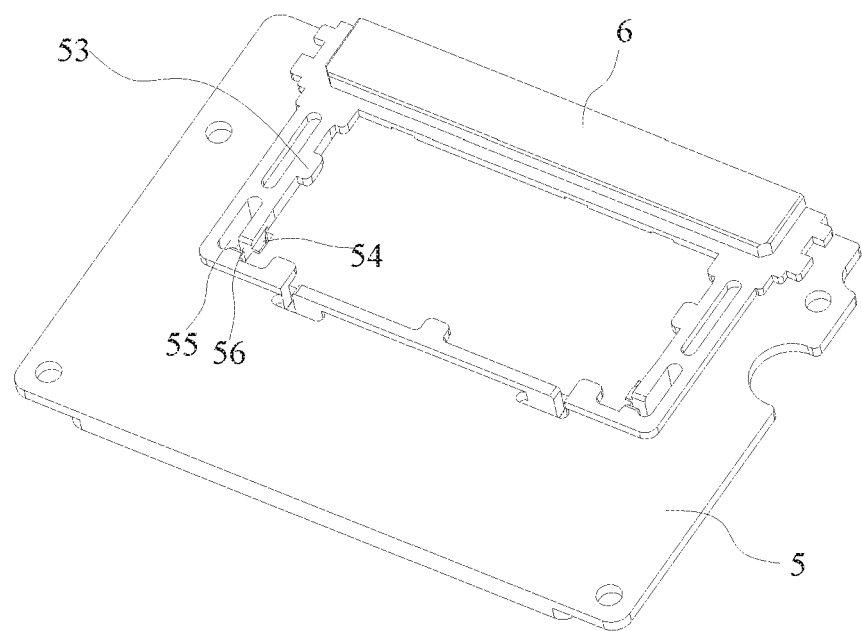
FIG. 6 illustrates a schematic diagram of the SSD storage module in FIG. 5, wherein the SSD storage module is inverted.
Figure 7:
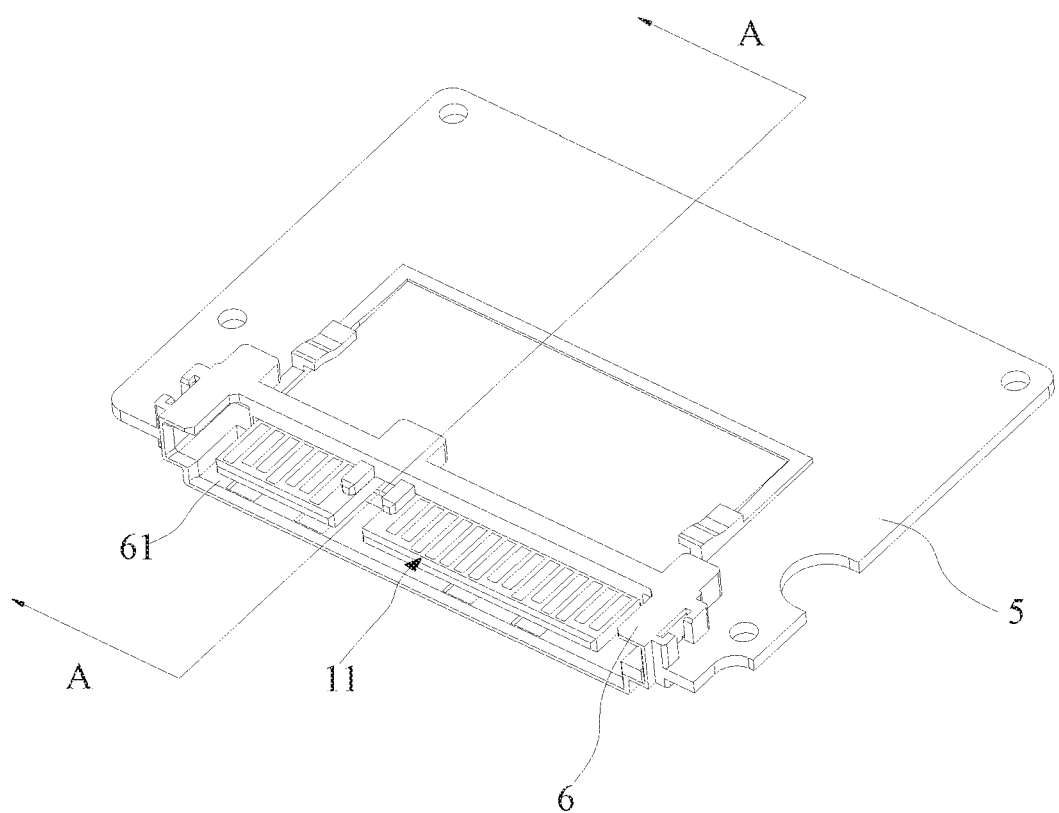
FIG. 7 illustrates a structural schematic view of a SSD storage module provided by a fifth embodiment of the present invention.
Figure 8:
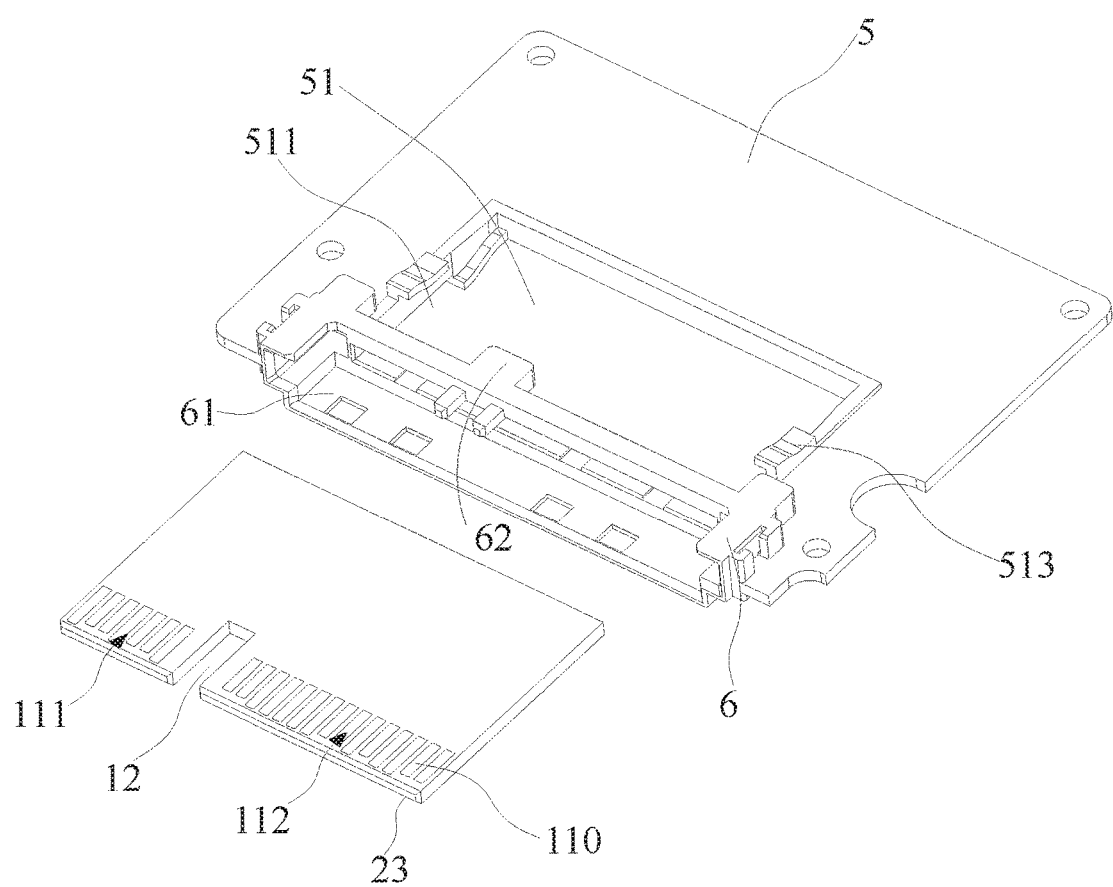
FIG. 8 illustrates a disassembled schematic view of the SSD storage module provided by the fifth embodiment of the present invention.
Figure 9:
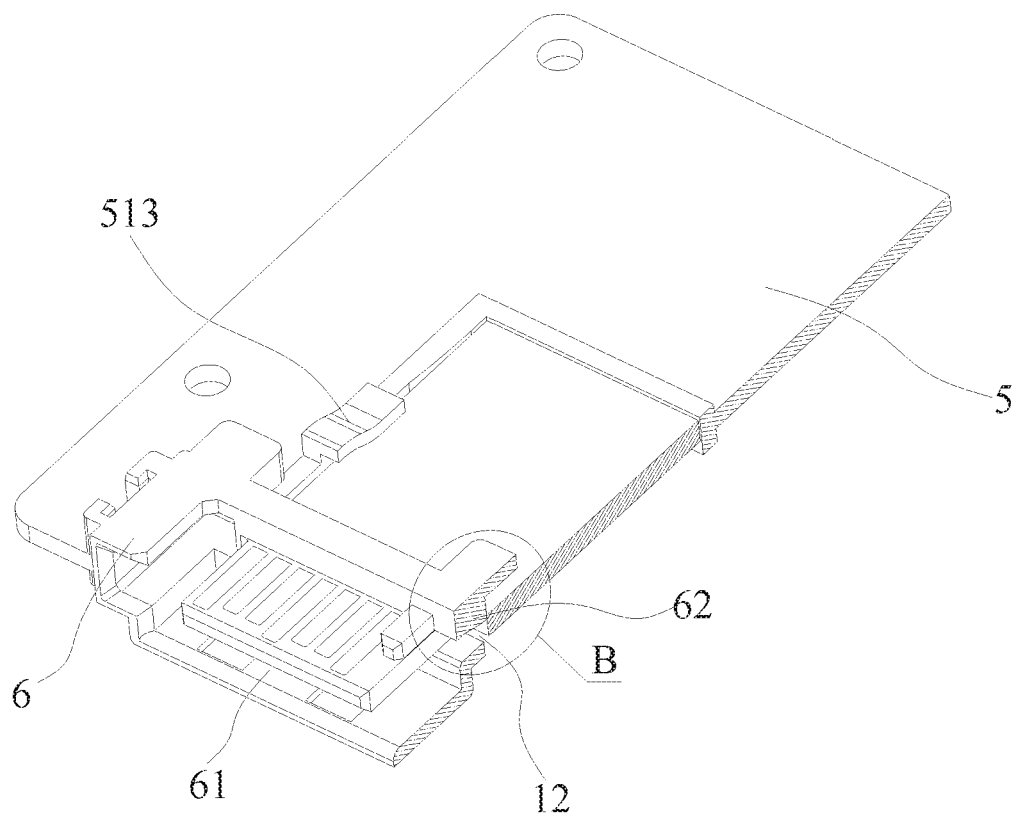
FIG. 9 illustrates a cross-section view along the A-A line in FIG. 7.
Figure 10:
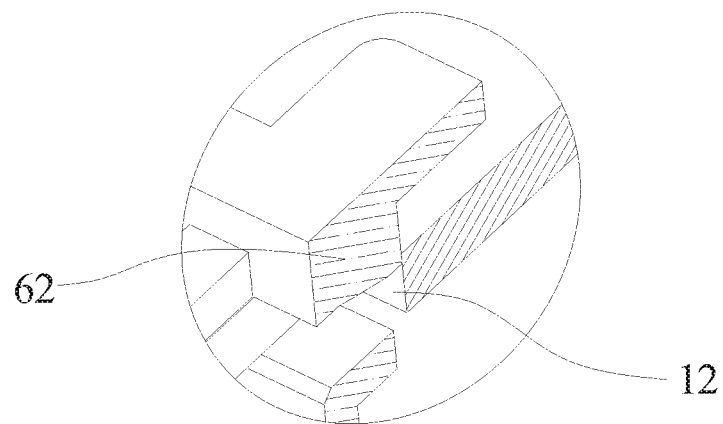
FIG. 10 illustrates an enlarged view of the part B in FIG. 9.
Figure 11:
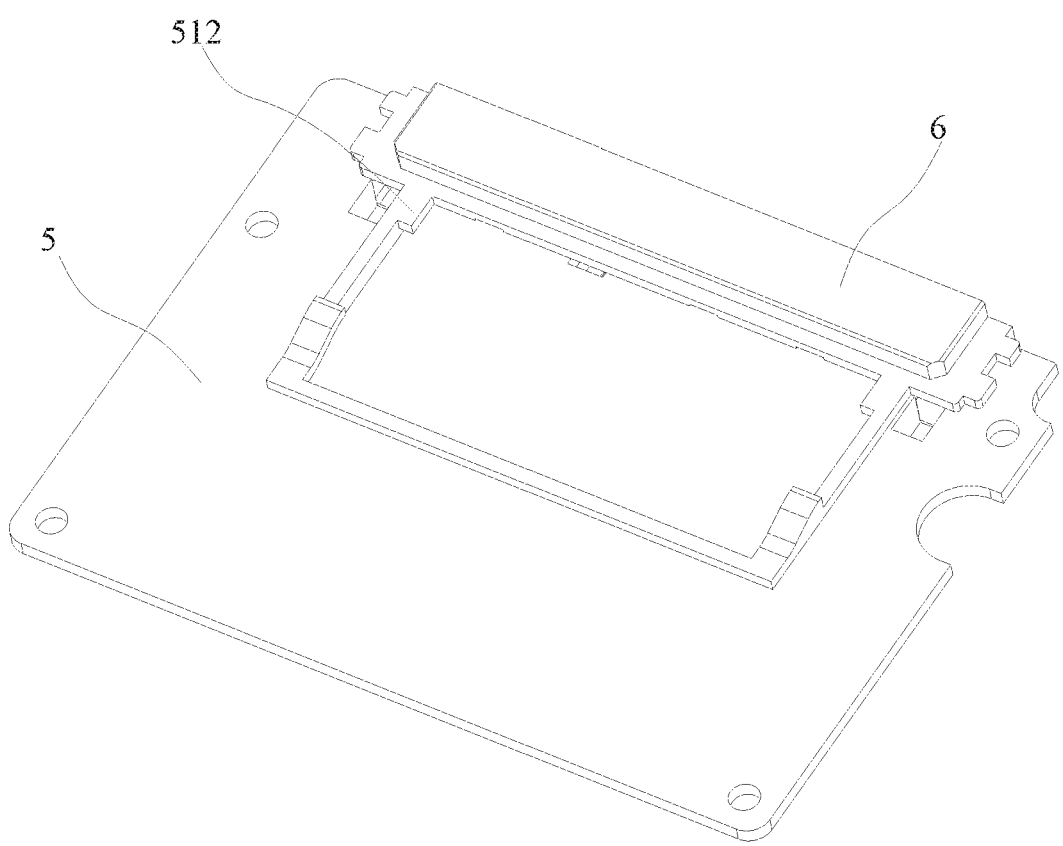
FIG. 11 illustrates a structural schematic view of the SSD storage module in FIG. 7, wherein the SSD storage module is reversed.

Please refer to FIGS. 5-6, the present invention further provides a SSD (Solid-State Drive) component which comprises a plate body 5, a plastic piece 6 arranged on the plate body 5 and a SSD storage module. The plastic piece 6 is provided thereon with an opening 61, the plate body 5 is provided thereon with a locating slot 51 which is adjacent to a side of the plastic piece 6 and is communicated with the opening 61; the SSD storage module inserts from the opening 61 and is received in the locating slot 51; the plurality of SATA (Serial Advanced Technology Attachment) interface contact pieces 110 are exposed at the opening 61 and constitute a standard SATA storage interface with the opening 61. The SATA storage interface is a computer bus interface and is configured for data transmission between a SSD and a main board. Since the plate body 5 is also provided thereon with other structures, by the plastic piece 6, the structure of the standard SATA storage interface is separately arranged, such that the structure of the plate body is simplified, the plate body 5 is easier to be manufactured, and product cost is reduced.

In this embodiment, the structure of the SSD storage module is the same as that of the SSD storage module in the third embodiment, and the SSD storage module is fixed in the locating slot 51 by multiple locating structures. Two opposite inner side edges of the locating slot 51 are respectively provided with two fixture blocks 54, when the SSD inserts inwardly and is fixed, the bayonets 4 arranged on two side edges of the SSD storage module can snap into two fixture blocks 54 respectively, such that a problem that the SSD storage module escapes from the opening 61 after it is inserted into the locating slot 51 can be effectively avoided.

Further, an edge of the locating slot 51 extends inwardly to form a plurality of upper retaining blocks 52 and lower retaining blocks 53, the plurality of upper retaining blocks 52 and lower retaining blocks 53 are not correspondingly arranged; of course, they can also be correspondingly arranged. In this way, the lower retaining blocks 53 can provide a upward support function to a corresponding edge of the SSD storage module, and the upper retaining blocks 52 can provide a downward limit function to a corresponding edge of the SSD storage module; the edges of the SSD storage module are clamped between the upper retaining blocks 52 and the lower retaining blocks 53, such that the SSD storage module can be prevented from moving upwardly or downwardly.

Meanwhile, the two opposite side edges of the locating slot 51 are provided with a plurality of hollow slots 55 and through-holes 56 arranged at the places of the upper retaining blocks 52 and the lower retaining blocks 53. The through-holes 56 are arranged along corresponding edges of the locating slot 51 and the hollow slots 55 are communicated with the corresponding through-holes. The arrangement of the hollow slots 55 and the through-holes 56 can provide a vibration absorption function, a problem that the SSD storage module generates vibrations and gets loose under the influence of external forces after being inserted into the locating slot 51 can be avoided as much as possible. Meanwhile, the arrangement of the hollow slots 55 and the through holes 56 can also facilitate an insertion operation of the SSD storage module. Specifically, the two opposite side edges of the locating slot 51 are respectively provided with a plurality of hollow slots 55 and through-holes 56, such that the correspondingly arranged hollow slots 55 and the through-holes 56 can enhance elasticity of a left edge and a right edge of the locating slot 51, thereby enabling the printed circuit board 1 to be reliably fixed in a left direction and a right direction.

Meanwhile, an edge of the locating slot 51 opposite to the opening 61 of the plastic piece 6 is provided thereon with a plurality of bulges 58, and the hollow slots 55 and the through-holes 56 are defined in the bulges 58. When the SSD storage module inserts into the locating slot 51, since the arrangement of the bulges 58 can provide downward forces to the locating slot 51, due to the hollow slots 55 and the through-holes 56 arranged at the positions where the bulges lie, the locating slot 51 has much better elasticity; the downward forces can be neutralized by upward forces generated by deformations of the hollow slots 55 and the through-holes 56, such that the SSD storage module can be stably fixed in a front direction and a rear direction.

Furthermore, a lower surface of the plate body 5 is provided with a plurality of reinforcing ribs 57 which are adjacent to a side of the locating slot 51 and configured for enhancing a whole strength of the plate body 5. These reinforcing ribs 57 are arranged to form groined shapes, and a rectangular slot is formed between every two adjacent reinforcing ribs 57.

Embodiment V

Please refer to FIGS. 7-11, this embodiment further provides another SSD (Solid-State Drive) component which comprises a plate body 5, a plastic piece 6 and the SSD storage module in the aforesaid first embodiment or in the second embodiment; the plastic piece 6 is arranged on the plate body 5 and is provided thereon with an opening 61, the plate body 5 is provided thereon with a locating slot 51 being arranged at the side of the plastic piece 6 and communicated with the opening 61, the SSD storage module inserts from the opening 61 and is received in the locating slot 51; a plurality of SATA (Serial Advanced Technology Attachment) interface contact pieces 61 are exposed at the opening 61 and constitute a standard SATA storage interface with the opening 61; the plastic piece 6 is provided thereon with a hook 62 located at an inner side of the opening 61 and hooked at a separation slot 12 of the SSD storage module.

Two side edges of the locating slot 51 are provided with two card slots 511 respectively, a bottom of each of the two card slots 511 is provided with a support plates 512, two ends of the SSD storage module are respectively placed on the two support plates 512; a top end of each of the two card slots 511 extend inwardly to form a pressing block 513, and the two pressing blocks 513 are arranged to press on the two ends of the SSD storage module respectively.

In assembly, two ends of the SSD storage module engage in the two card slots 131 respectively, in this way, the two ends of the SSD storage module are restricted; moreover, the hook 62 is hooked by the separation slot 12, such that the SSD storage module can be restricted in a front direction and a rear direction. Due to cooperating effect of the support plates 512 and the press blocks 513 arranged at the places where the card slots 511 lie, the two ends of the SSD storage module can be clamped between the support plates 512 and the press blocks 513, such that the SSD storage module can be prevented from moving upwardly or downwardly.

Embodiment VI

A six embodiment of the present invention provides a SSD (Solid-State Drive), the SSD comprises the aforesaid SSD storage module in the first embodiment or in the second embodiment; or the SSD comprises the SSD component in the fourth embodiment or in the fifth embodiment.

In the embodiments of the present invention, the SSD storage module comprises a printed circuit board 1, an encapsulating colloid 2 and an electronic circuit 3 welded on an inner surface of the printed circuit board 1 and having a data storage function; the encapsulating colloid 2 is formed on the inner surface of the printed circuit board 1 and is configured for seamlessly encapsulating the electronic circuit 3; an outer surface of the printed circuit board 1 is provided with a plurality of metal contact pieces 11 that are electrically connected to the electronic circuit 3; the plurality of metal contact pieces 11 comprise a plurality of SATA (Serial Advanced Technology Attachment) interface contact pieces 110. In the embodiments of the present invention, the encapsulating colloid 2 is configured for seamlessly encapsulating the electronic circuit 3 welded on the inner surface of the printed circuit board 1, the encapsulating colloid 2 isolates the electronic circuit 3 from the air, such that the problem that the electronic circuit 3 is directly exposed in the air, performances of components of the electronic circuit 3 are affected, thereby resulting in an unstable functionality of the SSD can be avoided.

The aforementioned embodiments are only preferred embodiments of the present invention, and should not be regarded as being any limitation to the present invention. Any modification, equivalent replacement, improvement, and so on, which are made within the spirit and the principle of the present invention, should be included within the protection scope of the present invention.

The invention claimed is:

1. A SSD storage module, comprising a printed circuit board, an encapsulating colloid, an electronic circuit welded on an inner surface of the printed circuit board and having a data storage function, and a SSD component which comprises a plate body;

the encapsulating colloid is formed on an inner surface of the printed circuit board and is configured for seamlessly encapsulating the electronic circuit;

an outer surface of the printed circuit board is provided with a plurality of metal contact pieces that are electrically connected with the electric circuit, and the plurality of metal contact pieces comprise a plurality of SATA interface contact pieces;

the electronic circuit comprises a control integrated circuit, a storage integrated circuit, and an auxiliary circuit; the control integrated circuit is electrically connected with the storage integrated circuit and the auxiliary circuit respectively;

the plurality of SATA interface contact pieces are all strip-shaped, lengths of the plurality of SATA interface contact pieces are not all identical, and the plurality of SATA interface contact pieces are arranged on a side of the outer surface of the printed circuit board, wherein both the control integrated circuit and the storage integrated circuit are integrated circuit crystal grains that are not encapsulated, wherein the SSD component further comprises a plastic piece which is arranged on the plate body and is provided with an opening, the plate body is provided thereon with a locating slot which is adjacent to a side of the plastic piece and is communicated with the opening; two opposite inner side edges of the locating slot are provided with two fixture blocks respectively; the SSD storage module inserts from the opening and is received in the locating slot, the two fixture blocks engage in two bayonets of the SSD storage module respectively; and each of the two opposite side edges of the locating slot extends inwardly to form a plurality of upper retaining blocks and lower retaining blocks, two edges of the SSD storage module are stuck between the plurality of upper retaining blocks and the lower retaining blocks respectively; and the two opposite side edges of the locating slot are provided with hollow slots and through-holes are define in bulges and located adjacent to the two fixture blocks respectively; the bulges can provide downward forces which can be neutralized by upward forces generated by deformations of the hollow slots and the through-holes.

2. The SSD storage module according to claim 1, wherein, a side of the printed circuit board where the plurality of SATA contact pieces are arranged is provided with a separation slot, in a direction vertical to the printed circuit board, the separation slot penetrates from the outer surface of the printed circuit surface to an inner surface the printed circuit board and the encapsulating colloid; the plurality of SATA interface contact pieces are divided by the separation slot into a first contact piece area and a second contact piece area, and the side of the printed circuit board provided with the separation slot and the plurality of SATA interface contact pieces serves as a component part of a standard SATA interface assembly.

3. The SSD storage module according to claim 2, wherein, the first contact piece area is provided with seven metal contact pieces, and the second contact piece is provided with fifteen metal contact pieces.

4. The SSD storage module according to claim 3, wherein, each of two edges of an end surface of SSD storage module that is at the same side as the separation slot is provided with a bevel edge.

5. The SSD storage module according to claim 1, wherein, a module formed by encapsulating the printed circuit board with the encapsulating colloid has a length of 33.4±0.08 mm, a width of 22.6±0.1 mm and a height of 1.23±0.05 mm; or has a length of 33.4±0.08 mm, a width of 17.2±0.1 mm, and a height of 1.23±0.05 mm; or has a length of 33.4±0.08 mm, a width of 15±0.1 mm and a height of 1.23±0.05 mm.

6. The SSD storage module according to claim 2, wherein, two side edges of an end of the module assembled by encapsulating the printed circuit board with the encapsulating colloid distant from the plurality of SATA interface contact pieces are provided respectively with a bayonet configured for fixedly fitting with an external structure.

7. The SSD storage module according to claim 1, wherein: a lower surface of the plate body is provided with a plurality of reinforcing ribs located at a side of the locating slot.

8. A SSD, comprising the SSD storage module according to claim 2.

9. The SSD according to claim 8, wherein, two side edges of an end of the SSD storage module distant from the plurality of SATA interface contact pieces are provided respectively with a bayonet configured for fixedly fitting with an external structure.

* * * * *